United States Patent
Jourdain et al.

(10) Patent No.: US 8,976,777 B2
(45) Date of Patent: Mar. 10, 2015

(54) IP COMMUNICATION DEVICE AND SINGLE-OSCILLATOR RADIO AND OSCILLATOR CONTROL METHOD

(75) Inventors: Laurent Jourdain, Rueil Malmaison (FR); Freddy Donnenwirth, Rueil Malmaison (FR); Frédéric Geheniau, Rueil Malmaison (FR)

(73) Assignee: Sagemcom Energy & Telecom SAS, Rueil Malmaison (FR)

( * ) Notice: Subject to any disclaimer, the term of this patent is extended or adjusted under 35 U.S.C. 154(b) by 143 days.

(21) Appl. No.: 13/501,616

(22) PCT Filed: Oct. 12, 2010

(86) PCT No.: PCT/EP2010/065249
§ 371 (c)(1),
(2), (4) Date: Apr. 12, 2012

(87) PCT Pub. No.: WO2011/045300
PCT Pub. Date: Apr. 21, 2011

(65) Prior Publication Data
US 2012/0201236 A1    Aug. 9, 2012

(30) Foreign Application Priority Data

Oct. 15, 2009   (FR) ...................................... 09 57230

(51) Int. Cl.
*H04W 56/00*   (2009.01)
*H03L 7/08*    (2006.01)
(Continued)

(52) U.S. Cl.
CPC .. *H03L 7/08* (2013.01); *H03L 7/16* (2013.01); *H04J 3/0667* (2013.01); *H04J 3/0697* (2013.01)
USPC ............................. 370/350; 370/503; 455/502

(58) Field of Classification Search
CPC .......... H03C 7/00; H04L 7/06; H04L 7/0079; H04J 3/0685; H04J 3/0667; H04J 3/065; H04J 3/0632; H04J 3/0658; G06F 1/0328; H03L 7/0805; H03L 7/085; H03L 7/089

USPC .......... 375/354–360; 331/1–25; 370/350, 503
See application file for complete search history.

(56) References Cited

U.S. PATENT DOCUMENTS 5,402,082 A * 3/1995 Eccleston et al. ............. 327/530
6,639,957 B2 * 10/2003 Cahill-O'Brien et al. .... 375/354
(Continued)

FOREIGN PATENT DOCUMENTS

EP             1835616         9/2007
WO      WO 2006/110960     10/2006

OTHER PUBLICATIONS

International Preliminary Report on Patentability in English, dated May 18, 2012, for PCT/EP2010/065249.
(Continued)

*Primary Examiner* — Bob Phunkulh
*Assistant Examiner* — Rose Clark
(74) *Attorney, Agent, or Firm* — Nixon & Vanderhye, PC

(57) ABSTRACT

The invention relates to the field of radio communication devices and, more specifically, gateways connected firstly to a cellular radio communication network via a packet data communication network, such as an IP network, and secondly to cellular mobile communication terminals. The invention proposes to use the same oscillator to provide both the reference clock of the radio subsystem and the reference clock of the general processor of the device. The fact that the same oscillator is used for these two components also allows embodiments in which some of the functions that have hitherto been devolved to a hardware control component, itself operating by means of a clock derived from the radio oscillator and being involved in the control of said oscillator, can now be devolved to a software component that is executed on the general processor of the gateway.

7 Claims, 5 Drawing Sheets

(51) Int. Cl.
*H03L 7/16* (2006.01)
*H04J 3/06* (2006.01)

(56) References Cited

U.S. PATENT DOCUMENTS

| | | | |
|---|---|---|---|
| 6,898,721 B2 | 5/2005 | Schmidt | |
| 7,683,707 B2 * | 3/2010 | Ljusev et al. | 330/10 |
| 2001/0022536 A1 * | 9/2001 | Kallio et al. | 331/1 R |
| 2006/0280182 A1 | 12/2006 | Williams et al. | |
| 2007/0097947 A1 * | 5/2007 | Aweya et al. | 370/350 |
| 2008/0106342 A1 | 5/2008 | Okamoto et al. | |
| 2010/0118894 A1 * | 5/2010 | Aweya et al. | 370/503 |
| 2010/0118895 A1 * | 5/2010 | Radulescu | 370/503 |
| 2010/0158051 A1 * | 6/2010 | Hadzic et al. | 370/503 |
| 2010/0228881 A1 | 9/2010 | Williams et al. | |

OTHER PUBLICATIONS

International Search Report for PCT/EP2010/065249 mailed 6 Jun. 2011.

B. Ogilvie, Clock Solutions for WiFi (IEEE 802.11), SaRonix A Pericom Company, May 9, 2003, pp. 1-4.

Written Opinion of the International Searching Authority mailed Jun. 6, 2011.

* cited by examiner

IP COMMUNICATION DEVICE AND SINGLE-OSCILLATOR RADIO AND OSCILLATOR CONTROL METHOD

This application is the U.S. national phase of International Application No. PCT/EP2010/065249 filed 12 Oct. 2010 which designated the U.S. and claims priority to FR 09/57230 filed 15 Oct. 2009, the entire contents of each of which are hereby incorporated by reference.

The present invention concerns the field of radio communication devices and more particularly gateways connected firstly to a cellular radio communication network through a packet data communication network such as an IP network (Internet Protocol network, defined in RFC 791) and secondly to cellular mobile communication terminals. Cellular mobile telephony base stations are an example of such gateways.

The general architecture of such gateways is illustrated schematically in FIG. 1. The gateway 1.1 comprises a radio module 1.2 that manages the radio communications. It also comprises a network interface 1.3, for example an Ethernet interface according to the international standard ISO/IEC 8802-3. The gateway functions under the control of a general processor 1.4 by means of programs stored in a memory 1.5. These various modules communicate by means of a data bus 1.6.

We are concerned more particularly with the generation of the clocks necessary for the functioning of these gateways. Firstly, the processor requires a reference clock for its functioning. This clock is typically in the frequency range of a few tens of megahertz. A slight drift of this clock is generally not detrimental.

Secondly, the radio communication module requires a reference clock of around 20 MHz, this frequency then being multiplied in order to obtain the radio frequency. This clock must be very precise. The drifts tolerable are here very small. For example, the gateways functioning according to the third-generation HSPA (High Speed Packet Access) standard functions at a radio frequency of around 2 gigahertz and must comply with a drift of less than 250 ppb (parts per billion) for the complete system. To guarantee this, the clock must also comply with a drift of less than 250 ppb.

In order to be able to comply with this severe constraint on the drift of the clock necessary for the radio subsystem, this clock must be synchronised by means of an external clock. The known solutions typically use a GPS (Global Positioning System) reception module, the GPS signal containing a very precise clock, or a synchronous telecommunication interface enabling an external reference clock to be connected. These solutions can be envisaged for professional equipment such as base stations in a cellular telephone network. On the other hand they prove to be expensive and unsuitable for general public base stations intended to be installed at the home of the users connected to their local network.

In the context of general-public apparatus, it is tempting to use the existing connection to the packet data network to connect to external clocks for synchronising the reference clock of the radio subsystem. It is for example possible to use a connection to reference clocks available through the Internet by means of the NTP (Network Time Protocol defined by RFC 1305) or the PTP (Precision Time Protocol) standardised by the IEEE under the reference IEEE 1588 and standardised under the reference IEC 61588. Apparatus functioning under this principle is typically managed by a processor supplied by a local reference clock. The reference clock of the radio subsystem is then generated by a dedicated oscillator. This oscillator is controlled by a dedicated hardware component. This hardware component manages the synchronisation protocol, for example NTP, and controls the oscillator in order to limit the drift thereof and to maintain it within the acceptable tolerance.

The invention aims at proposing a solution for further reducing the cost and gaining in design simplicity of such gateways. To do this, it proposes using the same oscillator for providing firstly the reference clock of the radio subsystem, but also for providing the reference clock of the general processor of the device. Using the same oscillator for these two components also makes it possible to propose embodiments where some of the functions up until then devolved to a hardware control component functioning itself by means of a clock derived from the radio oscillator and participating in the control of this oscillator can now be devolved to a software component executed on the general processor of the gateway.

The invention concerns a communication device comprising a communication interface with a packet communication network; a general processor; a radio communication subsystem; an oscillator for generating the reference clock signal of the radio communication subsystem; synchronisation means for synchronising the reference clock signal of the radio communication subsystem with at least one distant reference source over the packet communication network and means for generating the reference clock of the general processor and the reference clock of the radio subsystem from the same oscillator.

According to a particular embodiment of the invention, the synchronisation means comprise software means for timestamping data packets exchanged between the device and the distant reference source executed by the general processor.

According to a particular embodiment of the invention, the synchronisation means comprise means for controlling the frequency of the oscillator.

According to a particular embodiment of the invention, the device also comprises software means for maintaining the oscillator at constant temperature by means of a radiator.

According to a particular embodiment of the invention, the means for controlling the frequency of the oscillator comprise a time synchronisation protocol that generates samples with two values, a first one relating to the stability of a clock and a second one relating to the frequency drift and an algorithm controlling the oscillator for generating a voltage value from the samples issued from the time synchronisation protocol.

According to a particular embodiment of the invention, the central processor having a PWM converter, the oscillator control algorithm has means for generating a PWM signal by means of this converter from the voltage value; the device also comprising a circuit that converts this PWM signal into a voltage signal applied to the oscillator shaped and filtered with sufficient precision and stability to ensure the final precision of the frequency of the system.

According to a particular embodiment of the invention, said circuit is composed of:
 a voltage calibrator receiving the PWM signal;
 a second-order low-pass filter filtering the output of the voltage calibrator;
 an operational amplifier connected as a follower and interposed between the output of the second-order low-pass filter and said oscillator.

Thus it is possible to choose standard components, at low cost, for fulfilling the oscillator control function.

According to a particular embodiment of the invention, a logic gate is interposed between the PWM converter and the voltage calibrator 9.2 and is suitable for reducing the transition times of the PWM signal.

Thus, the precision of the oscillator control voltage value is increased.

According to a particular embodiment of the invention, the oscillator control algorithm comprises: means for receiving the samples issued from the synchronisation protocol; qualification means for eliminating the samples the stability of which is insufficient; sorting means for sorting the qualified samples by the drift value thereof and eliminating the samples with the smallest and greatest drift; means for calculating the average of the drift of the remaining samples and means for calculating the voltage from the average.

The invention also concerns an oscillator control method that comprises a step of receiving the samples issued from the synchronisation protocol; a qualification step of eliminating the samples the stability of which is insufficient; a sorting step of sorting the qualified samples by the drift value thereof and eliminating the samples with the smallest and greatest drift; a step of calculating the average of the drift of the remaining samples and a step of calculating the voltage from the average.

The features of the invention mentioned above, as well as others, will emerge more clearly from a reading of the following description of an example embodiment, said description being given in relation to the accompanying drawings, among which:

The functioning of a gateway based on separate clock domains for the general processor and for the radio subsystem is described in more detail.

Figure 1:
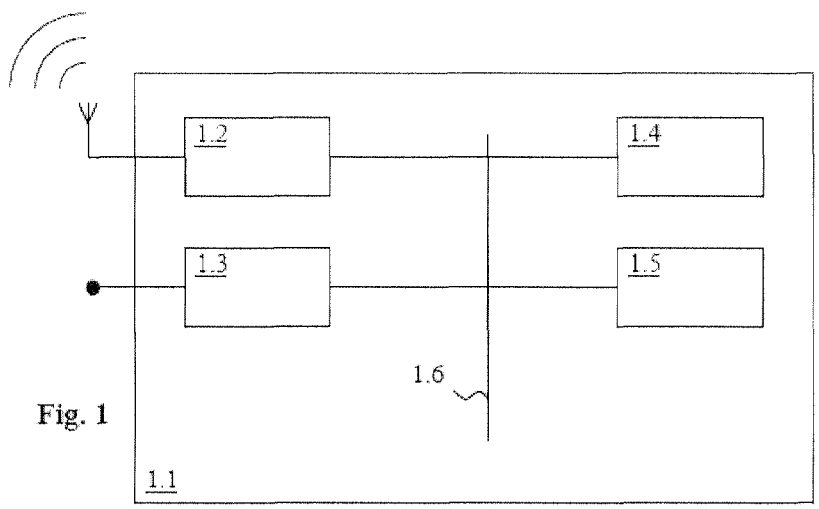
FIG. 1 illustrates the general gateway architecture according to the prior art.
Figure 2:
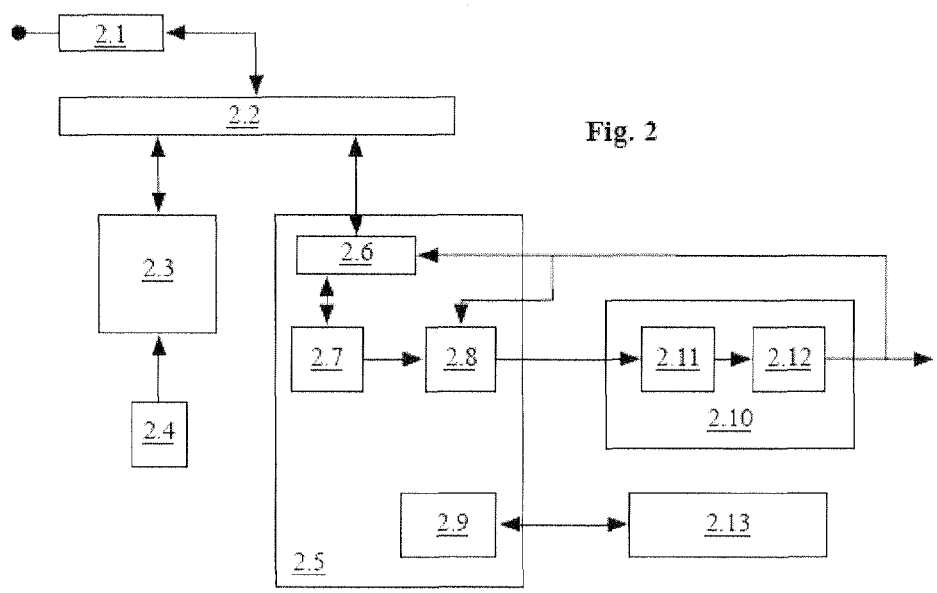
FIG. 2 illustrates an example of architecture according to the invention.

FIG. 2 illustrates an example of such an architecture for a gateway using such a protocol for synchronising its reference clock of the radio subsystem. The gateway is connected to a data communication network by an Ethernet physical interface 2.1. The Ethernet traffic is directed to an Ethernet splitter 2.2. The function of this splitter is to separate the packets linked to the clock synchronisation protocol, for example NTP, from the other packets linked to the network exchanges of the gateway and managed by the stack of communication protocols installed in the execution system of the gateway. This stack of protocols is executed on the processor 2.3. For its functioning, this processor receives a reference clock signal issuing from a local oscillator 2.4 in a conventional manner.

The gateway also contains a component 2.5 for controlling an oscillator generating the reference clock of the radio subsystem. This oscillator 2.10 comprises the oscillator proper 2.12, typically a voltage controlled oscillator or VCXO. The control voltage comes from the digital to analogue converter 2.11, which converts a digital voltage signal received from the control component 2.5.

The control component 2.5 maintains a timestamp counter 2.6 which for its part serves to timestamp the packets of the NTP protocol that it exchanges with the Ethernet splitter 2.2. This counter functions by means of a clock signal issuing from the oscillator 2.10. The value of this timestamp counter 2.6 is used by a module managing the time synchronisation protocol 2.7. It is this management module that generates the frequency correction signal, which it passes to a frequency control module 2.8. The latter then generates, according to this frequency correction signal, the frequency control signal, in this case a digital voltage value, sent to the oscillator 2.10.

The control component 2.5 also contains a module 2.9 managing the temperature of the oscillator 2.10. This module controls a heating module 2.13 for maintaining the oscillator at a constant temperature assisting the stability thereof.

We will not here go into the exact description of the NTP protocol for synchronising the oscillator. This protocol is described in RFC 1305 and use thereof for controlling an oscillator is known. The control component 2.5 is a known component available commercially, for example the SEMTECH components in the ToPSync™ family providing a synchronisation solution on PTP, other designs in FPGA offering synchronisation solutions on NTP.

It should be noted that the functioning of this architecture is based on the fact that the counter 2.6 that serves for timestamping the NTP packets for the module 2.7 managing the time synchronisation protocol functions at a rate generated by a clock signal issuing from the oscillator 2.10 that it is sought to synchronise.

The invention is based on a simplification of this architecture aiming to use only one oscillator both for the radio subsystem and for the general processor of the gateway and the network interface. The use of a single clock source for the entire system also enables several additional optional improvements. Advantageously, the clock of the main processor can be derived from the oscillator used by the radio subsystem. Advantageously, the hardware timestamp counter used in the prior art can be replaced by a software counter on the main processor. All the digital time functions used in particular by the NTP protocol, including the timestamping of the packets, generally executed by a related hardware component, can be taken over by the general processor. It is therefore possible to produce the gateway without using any specific component.

A minimum embodiment of the invention consists of replacing the generation module of the clock 2.4 in FIG. 2 supplying the main processor with a clock signal derived from the oscillator 2.10. This embodiment already affords a simplification of the architecture and a reduction in the manufacturing cost. However, it is possible to improve the solution further by transferring to the main processor all or some of the functions performed by the hardware components in the embodiment in FIG. 2.

Figure 3:
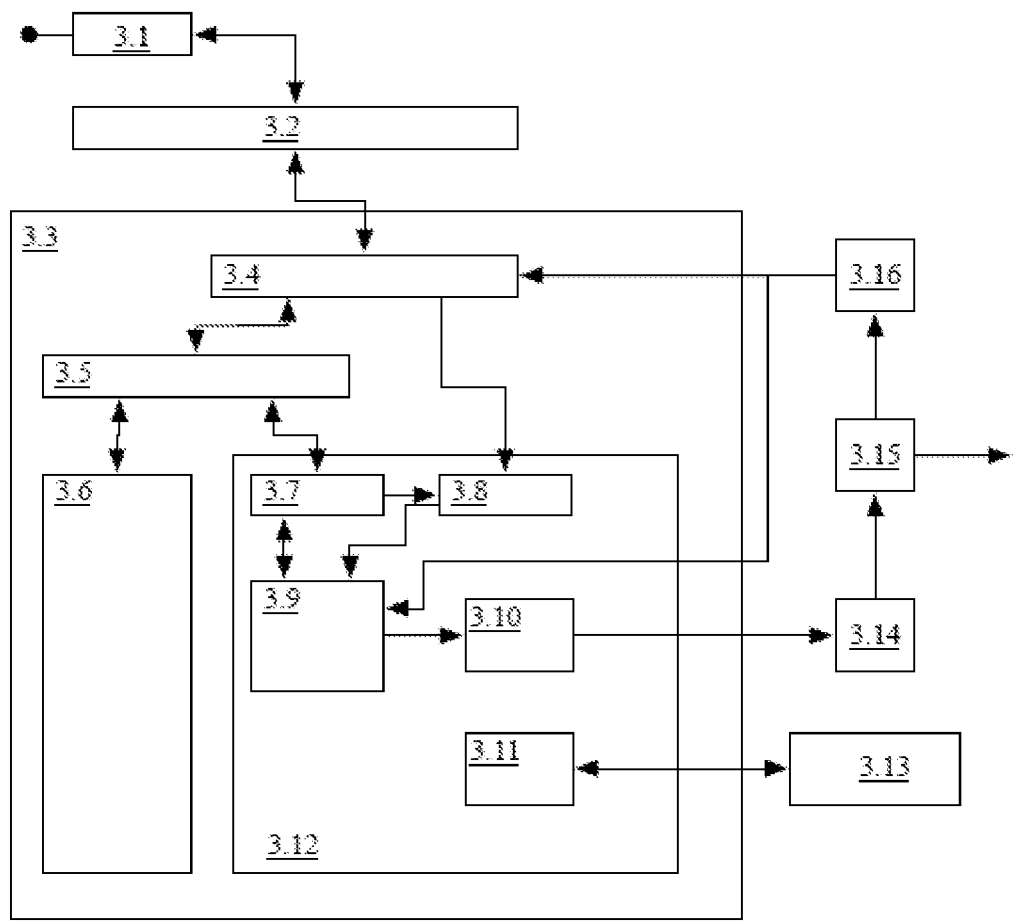
FIG. 3 illustrates the preferred embodiment of the invention.

FIG. 3 illustrates the preferred embodiment of the invention. In this figure there is the physical Ethernet interface 3.1 connected to a module controlling access to the support 3.2 or MAC (Medium Access Control) Ethernet. The module 3.3 represents the software executed on the general processor of the gateway. The Ethernet traffic passes through a unit managing the timestamps 3.4. This unit effects the transmission of the Ethernet frames between the hardware and the top software layers. It comprises a software time counter that enables the times of reception and sending of Ethernet frames to be timestamped. It stores these frame transmission times in a register. This information is then used by the time management client.

The Ethernet frames are next uploaded to the IP protocol stack 3.5. The frames not relating to the time management protocol are then available for the application managing the gateway 3.6.

The time management module 3.12 exchanges Ethernet frames dedicated to the time management protocol, NTP, PTP or other, with the IP stack 3.5 through the interface 3.7. These exchanges take place both in sending and reception. The frames sent will receive a timestamp of their time of sending by the timestamp management unit 3.4. These stamps making it possible to know the times of sending of the frames are uploaded by the management unit 3.4 to the module 3.12 via the timestamp interface 3.8. The frames received by the interface 3.7 are timestamped. In this way, the time synchronisation protocol 3.9 has knowledge of the times of sending and the times of receiving all the Ethernet frames relating to the NTP protocol. This time synchronisation protocol 3.9 is then in a position to keep the exact time current by means of these timestamps.

The time synchronisation protocol 3.9 that receives the clock signal issuing from the oscillator can then calculate its drift and send this drift to an algorithm 3.10 controlling the oscillator. This algorithm implements the control of the frequency. It uses the information produced by the time synchronisation protocol 3.9 and generates a 16-bit control word to control the local oscillator. This control word is then sent to a circuit 3.14 that converts it into a voltage signal applied to the voltage-controlled oscillator 3.15. Alternatively, when the central processor has a PWM (Pulse Width Modulation) converter, the control word generated by the time synchronisation protocol 3.9 is converted into a PWM signal that is sent to the circuit 3.14. This conversion is done with sufficient precision and stability to ensure the final precision of the frequency of the system. The oscillator 3.15 generates the output signal that will be used by the radio subsystem. This output signal is also used by a clock synthesizer 3.16. This synthesizer is typically a phase-locked loop PLL. This clock is used as a reference clock of the general processor and is sent to the unit managing the timestamps 3.4, where it serves to time the time counter, which allows software management of the timestamps. It is also sent to the physical Ethernet interface 3.1 and to the time synchronisation protocol 3.9, which will deduce its drift therefrom.

Advantageously, the module 3.12 also contains a temperature management algorithm 3.11 for keeping the oscillator 3.15 at constant temperature by means of the radiator 3.13.

Advantageously, it also contains a high-level controller enabling the oscillator to be calibrated in the factory in order to accelerate convergence on site of the synchronisation. This controller can also contain means of adapting the algorithms used to the different oscillators having variable characteristics. It can also make it possible to manage statuses, statistics, alarms and events in the time management module 3.12.

We shall now detail the functioning of the synchronisation process used in the invention.

Figure 4:
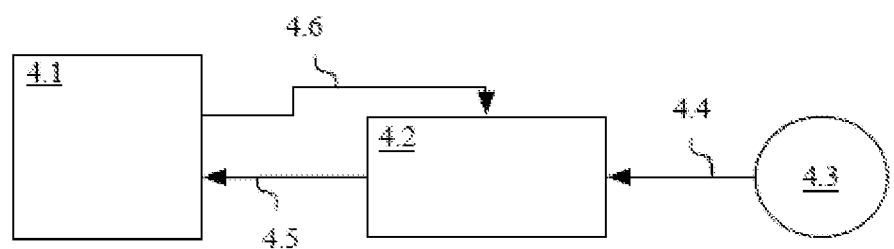
FIG. 4 illustrates the functioning of a conventional clock synchronisation process.

The functioning of a conventional clock synchronisation process is described by FIG. 4. According to this figure, an oscillator 4.3 sends a clock signal at a local natural frequency. This natural frequency 4.4 is received by a clock synthesizer 4.2, which divides it by a stored value in order to generate the adjusted clock 4.5. It is this adjusted clock 4.5 that is then corrected in order to compensate for the differences with a reference clock by means of the time synchronisation protocol 4.1. This compensation takes place by adjustment 4.6 of the stored value used to divide the natural frequency of the oscillator by the clock synthesizer 4.2. It will be noted that, according to this way of proceeding, the clock synchronisation takes place by adjusting the clock synthesis without intervention on the oscillator.

Figure 5:
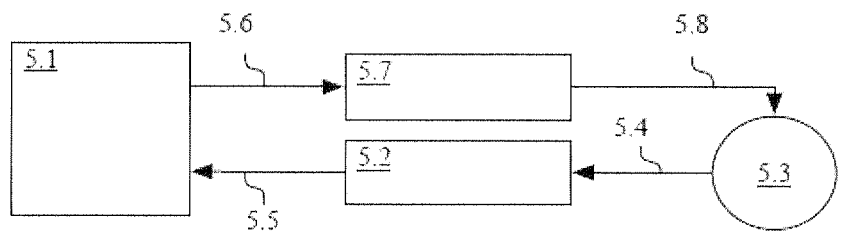
FIG. 5 illustrates the functioning of the synchronisation according to one embodiment of the invention.

FIG. 5 for its part illustrates the functioning of the synchronisation according to the invention. The aim is here to synchronise the frequency of the oscillator that is used by the radio subsystem. The oscillator 5.3 used is an oscillator that can be controlled, typically by a voltage. The controlled frequency 5.4 is sent to the clock synthesizer 5.2, which generates a controlled clock 5.5. This controlled clock is used by the time synchronisation protocol 5.1, which generates an adjustment value 5.6. Instead of being used directly by the synthesizer for adjusting the clock, this adjustment value is used by a module controlling the oscillator 5.7 in order to generate a value adjusting the frequency of the oscillator 5.8.

The time synchronisation protocol exchanges timestamps between the client and one or more distant servers. These timestamps are used for calculating the compensation and frequency drift between the local clock and the distant reference clock used by the servers. This compensation and drift are used to produce average values serving to adjust the time and frequency of the local clock.

Figure 6:
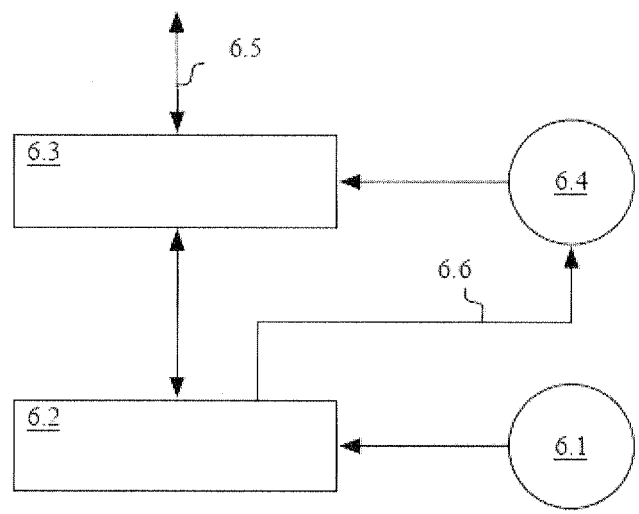
FIG. 6 illustrates the generation of timestamps in the case where a hardware packet timestamping unit is used.

FIG. 6 illustrates the generation of timestamps in the case where a hardware packet timestamping unit is used. The local clock that it is sought to synchronise is the clock 6.4. This clock serves to time the hardware timestamping unit 6.3. This timestamping unit exchanges a packet stream 6.5 with the reference server or servers. It places timestamps on these packets. The packets received for their part contain the timestamp of their time of sending relative to the reference clock of the server that sent them. The time management protocol 6.2 functions on a separate processor itself timed according to its own reference clock 6.1. This time management protocol 6.2 uses these timestamps for calculating the compensation and time drift of the clock to be synchronised 6.4 and derives therefrom an adjustment value 6.6 to correct it. Such hardware timestamping units are relatively expensive.

Figure 7:
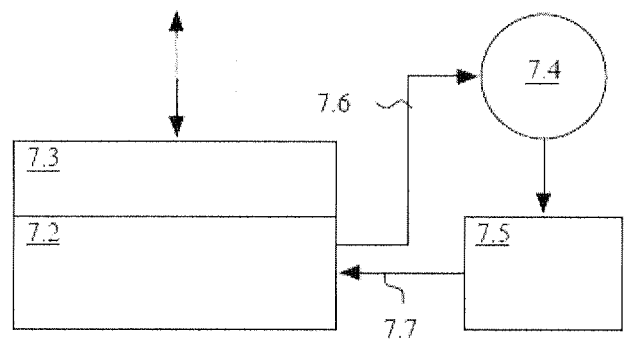
FIG. 7 illustrates the management of the timestamps according to one embodiment of the invention.

FIG. 7 illustrates the management of the timestamps according to the invention. The timestamping unit 7.3 is software and integrated in the software executed on the general processor. The time management protocol 7.2 is also executed on this same processor, the reference clock 7.7 of which is derived from the clock to be synchronised 7.4 by a clock synthesizer 7.5. The processor is therefore in a position to generate timestamps based on the clock to be synchronised. The processing of the timestamps relating to the packets 7.5 exchanged with the server or servers corresponds to that done previously and makes it possible to generate the adjustment value 7.6. Advantageously, the timestamping unit is implemented at the drivers of the operating system operating on the processor. This ensures a real-time processing of the packets and timestamping thereof and makes it possible to obtain performance with regard to a hardware implementation. In accordance with the standard, the packets are timestamped just after reception of the last bit for a received packet and just before the sending of the first bit for a sent packet.

Figure 8:
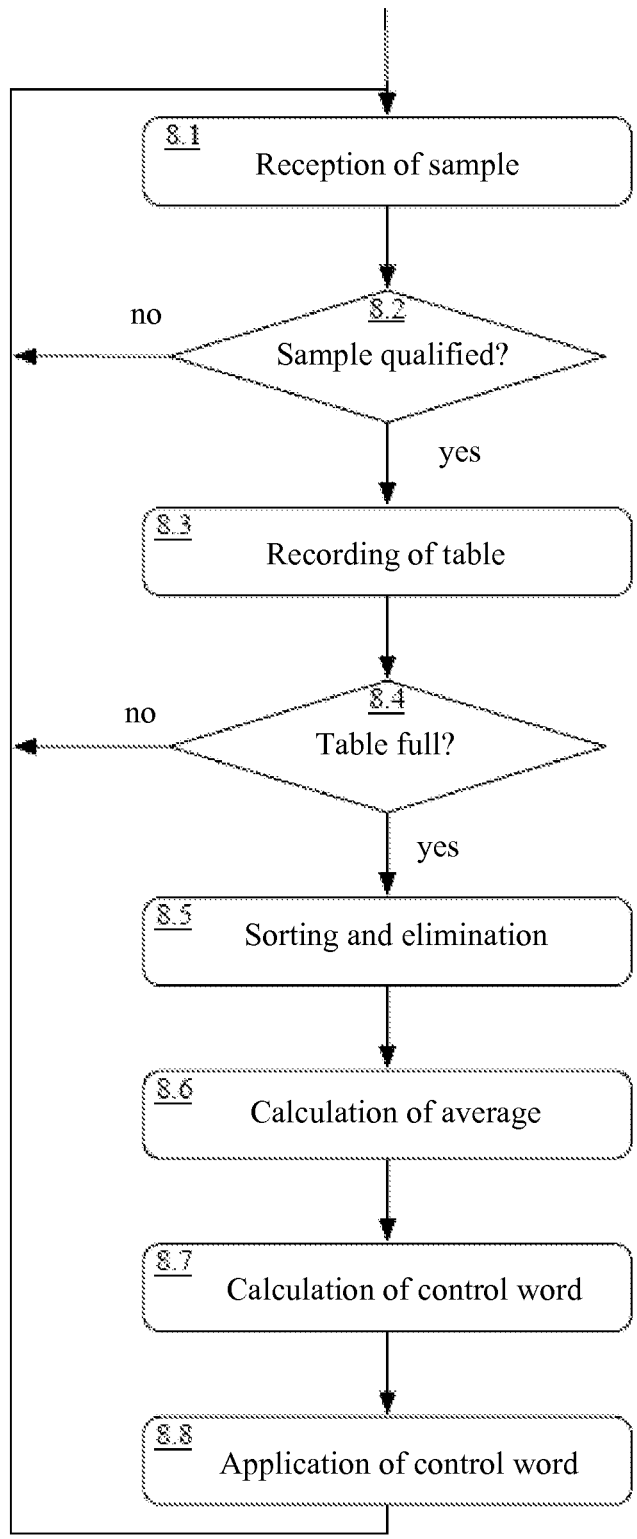
FIG. 8 illustrates the oscillator control method according to one embodiment of the invention.

The time synchronisation protocol used, typically NTP, generates samples with two values, a first value relating to the stability of the clock and a second relating to the frequency drift. The stability of the clock supplied by NTP is the relative frequency variation of the local clock calculated for a given sample compared with the previously estimated value of this frequency, it expresses the ability of the system to maintain a constant frequency. The frequency drift is the estimation of frequency variation between the local clock and the reference clock. The algorithm controlling the oscillator 3.10 must generate a voltage value in the form of a 16-bit word from the information issuing from the time synchronisation protocol and therefore the sample sent by it. In order to obtain good precision, it is necessary firstly to eliminate the aberrant samples and take an average. The aberrant samples may come from incidents related to the transport of the packets over the communication network between the gateway and the reference server or servers. The method used in the example embodiment for generating this voltage value for controlling the oscillator is described in relation to FIG. 8. This algorithm controlling the oscillator processes the samples issuing from the NTP protocol used by the time synchronisation protocol 3.9; it can be adapted for the use of PTP or other protocols.

During a first step 8.1, a sample therefore comprising a clock stability value and a drift value is received. During a step 8.2, it is checked whether or not this sample is qualified. This qualification consists of a test on the stability value in order to eliminate the samples the stability of which is insufficient, that is to say where the frequency estimation differs too greatly from the previous estimation. The qualified samples are then recorded in a table during step 8.3. It is then checked whether this table is full 8.4. When the table is full, the elements therein are sorted according to the drift value in order to determine the sample with the smallest drift and the sample with the largest drift, and these samples are then eliminated 8.5. The average of the drift is calculated on the remaining samples. The control word is then calculated according to the following formula:

$$C_n = C_o + \frac{D_m \cdot f_n \cdot a}{P};$$

where:

$C_n$ represents the new value of the control word;
$C_o$ represents the former value of the control word;
$D_m$ represents the average of the drift obtained at step 8.6 in parts per million (ppm);
$f_n$ represents the nominal frequency of the oscillator in Hz;
a represents an attenuation coefficient;
P represents the slope of the curve giving the frequency as a function of the voltage, or in other words the frequency drift for a difference of 1 in the control word. Its unit is in Hz per bit.

The slope of a curve can be given by the manufacturer of the oscillator. Advantageously, this slope is calculated during a calibration phase in the factory.

This control word must then be converted into an analogue signal that has to be applied to the oscillator. This conversion must be particularly precise and stable, in particular with respect to temperature or with respect to variation in power supply, in order to ensure the final stability and precision of the frequency of the system. It can be done by a dedicated digital to analogue converter. Advantageously, it may use, when such exists, a PWM (Pulse Width Modulation) converter, present on the central processor for supplying the analogue signal after shaping and filtering (circuit 3.14). Advantageously, the same method is used for the signal controlling the radiator enabling the temperature of the oscillator to be managed.

Figure 9:
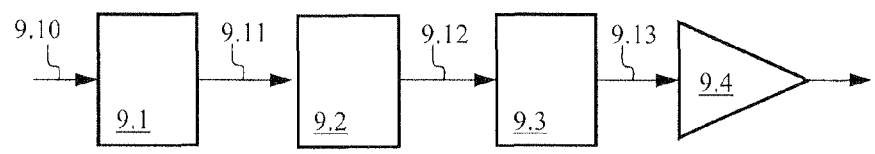
FIG. 9 illustrates schematically an oscillator voltage control mechanism according to one embodiment of the invention.

When the central processor has a PWM converter, it is possible to reduce the cost of the voltage control function of the oscillator and thus reduce the cost of the gateway compared with the use of a digital to analogue converter DAC. Such an embodiment of the circuit 3.14 is shown in FIG. 9 and is composed of a logic gate 9.1, a voltage calibrator 9.2 precise and stable for temperature and power supply, a second-order low-pass filter 9.3 and an operational amplifier 9.4.

The central processor delivers a PWM signal 9.10 with a peak to peak level that is not sufficiently stable in temperature and variation in supply to obtain the required precision and stability of the oscillator control voltage. The embodiment shown in FIG. 9 makes it possible to obtain sufficient precision and stability to ensure the final precision of the frequency of the oscillator.

The logic gate 9.1 is optional and makes it possible to reduce the transition times. It receives the PWM signal 9.10 supplied by the central processor and thus supplies a PWM signal 9.11 to the voltage calibrator 9.2. The voltage calibrator 9.2 transforms the pulse width modulation signal PWM, which is precise in pulse width, into a signal that is precise and stable in terms of peak to peak voltage level, while keeping the pulse-width precision and stability. Such a calibrator 9.2 is for example easily implemented by means of two enhanced MOSFETs (Metal Oxide Semiconductor Field-Effect Transistors), one n-channel and the other p-channel.

When the voltage calibrator 9.2 is implemented by means of two MOSFET transistors, the logic gate 9.1 makes it possible to have greater fan-out than that of the central processor, to control the gates of the field-effect transistors MOSFET. This makes it possible to obtain signals with lower and more stable transition times.

The signal 9.12 at the output of the voltage calibrator 9.2 is transformed to DC voltage 9.13 after passage through the second-order low-pass filter 9.3. The second-order low-pass filter 9.3 is for example composed of two cells of the RC (Resistance-Capacitance) type and transforms the PWM signal 9.12 issuing from the voltage calibrator 9.2 into DC voltage. The cut-off frequency of the low-pass filter is low compared with the frequency of the PWM signal in order to ensure negligible residual noise on the oscillator control voltage. The cut-off frequency of the second-order low-pass filter 9.3 is also high compared with the maximum-variation frequency of the oscillator control so that the frequency slaving functions correctly.

An example embodiment of the voltage calibrator 9.2 and of the second-order low-pass filter 9.3 is detailed below in relation to FIG. 10.

Finally, the operational amplifier 9.4 provides impedance matching between the output of the second-order low-pass filter 9.3 and the input of the oscillator. In this way, a DC voltage stable for temperature and supply variation and with the same pulse-width precision as that of the PWM signal supplied by the central processor is obtained at the output of the operational amplifier 9.4.

The operational amplifier 9.4 is connected as a follower and achieves the impedance matching between the output of the low-pass filter and the input of the oscillator, the operational amplifier 9.4 having a high input impedance compared with the impedance of the second-order low-pass filter 9.3 and a low output impedance compared with the input impedance of the oscillator. In this way, variations in the oscillator control voltage with the temperature variations of the input impedance of the oscillator are avoided.

Figure 10:
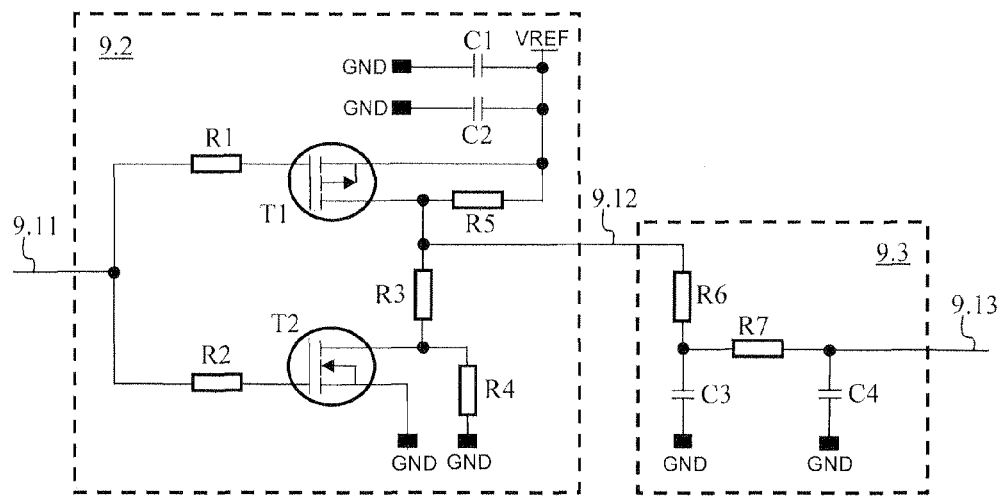
FIG. 10 illustrates schematically an embodiment of a calibrator and of a second-order low-pass filter, in one embodiment of the invention.

FIG. 10 illustrates schematically an embodiment of the voltage calibrator 9.2 and of the second-order low-pass filter 9.3.

The voltage calibrator 9.2 is mainly composed of two MOSFET field-effect transistors T1 to T2, a set of three resistors R3, R4 and R5, and reservoir capacitors C1 and C2. The transistor T1 is p-channel while the transistor T2 is n-channel.

The second-order low-pass filter 9.3 is composed of resistors R6 and R7 and capacitors C3 and C4.

When the level of the input signal of the voltage calibrator 9.2 is at the low state:
- the transistor T2 is off and has a high series resistance compared with the resistors R3, R4, R5 and R6;
- the transistor T2 is saturated and has a low series resistance compared with the resistors R3, R4, R5 and R6.

In this case, the voltage at the output of the voltage calibrator 9.2 is equal to VREF.

Conversely, when the level of the input signal of the voltage calibrator 9.2 is at the high state:
- the transistor T1 is off and has a high series resistance compared with the resistors R3, R4, R5 and R6;
- the transistor T2 is saturated and has a low series resistance compared with the resistors R3, R4, R5 and R6.

In this case, the voltage at the output of the voltage calibrator 9.2 is equal to:

$$V=[(1+(X*(R5/R6)))/(1+(R5/R3)+(X*(R5/R6)))]*VREF.=A*VREF$$

with X the duty cycle of the signal PWM, between 0 and 1.

A peak to peak voltage at the output of the voltage calibrator 9.2 is derived from this, equal to (1−A)*VREF.

The voltage VREF is defined according to the operating range of the oscillator control, the main parameter being the variation in the voltage as a function of temperature, this parameter applying mainly for the high levels at the output of the transistors T1 and T2.

During transitions, where the two transistors T1 and T2 are saturated at the same time, the current output by the voltage reference is limited to VREF/R3. The reservoir capacitors C1 and C2 make it possible to supply the surge relating to these transitions.

A parameter that varies the oscillator control voltage is the variation in temperature of the leakage current of the transistor T1, when the output levels of the transistors T1 and T2 are at the low state. The influence of the leakage current of the transistor T2 is negligible.

Another parameter that varies the control voltage of the oscillator is the variation in the propagation time of the transitions of the signal 9.11 via the transistors T1 and T2, as a function of the temperature. Since these transitions are not of zero duration, the variations in the threshold voltage as a function of temperature cause variations in this propagation time.

Another parameter that varies the control voltage of the oscillator is the minimal resistance of the drain-source channel RDS(on) of the transistor T2, this parameter applying for the low levels at the output of the transistors T1 and T2.

Another parameter that varies the control voltage of the oscillator is the minimal resistance of the drain-source channel RDS(on) of the transistor T1, this parameter applying for the high levels at the output of the transistors T1 and T2.

It should be noted that, the transistors T1 and T2 being of the MOSFET type, their input capacitances vary very little with temperature, which causes a negligible variation in the oscillator control voltage.

Another parameter that varies the control voltage of the oscillator is the variation in temperature of the resistors R3 and R5 when the output levels of the transistors T1 and T2 are at the low state.

It should be noted that the contributions of the parameters cited above in the variations in the oscillator control voltage are not directly added to each other and have a tendency to balance each other out since they act in a distributed manner on the high or low levels.

Thus it is possible to choose standard components, at low cost, for fulfilling the oscillator control function, taking account of these constraints related to the variations in the oscillator control voltage.

The linearity of the embodiment presented in FIG. 10 is mainly given by the jitter of the PWM signal 9.10, this being related to that of the control signal driving the central processor, and to the difference between rising and falling edges at the output of the voltage calibrator 9.2, the linearity of the operational amplifier 9.4 and the input resistance R6 of the second-order low-pass filter 9.3, the resistance R3 having to be negligible compared with the resistance R6.

The characteristics of the frequency control of the oscillators can vary from one sample to another. Advantageously, a calibration of each oscillator in the factory is carried out. This calibration makes it possible to store a set of pairs of values establishing the match between a control word and the associated frequency obtained. The device is then provided with means of storing a table containing these pairs of values. These are then used by the time management protocol and by the frequency control algorithm. If the curve establishing the match between the voltage and the frequency is linear, two points suffice to establish the nominal frequency and the slope of the curve.

The invention described here makes it possible to design any type of apparatus connected firstly to a packet data communication network and secondly having a radio communication subsystem based on a single clock generation system serving as a reference and to the radio subsystem and to the general processor managing the apparatus.

The invention claimed is:

1. A communication device comprising:
   a communication interface with a packet communication network;
   a general processor;
   a radio communication subsystem;
   an oscillator for generating a reference clock signal of the radio communication subsystem;
   wherein the communication device also comprises
   a clock synthesizer for generating the reference clock of the general processor and the reference clock of the radio subsystem from the single oscillator,
   wherein the communication device stores software intended to be executed by the general processor for synchronizing the reference clock signal of the radio communication subsystem with at least one distant reference source over the packet communication network by:
   timestamping data packets exchanged between the device and the distant reference source;
   controlling the frequency of the oscillator; and
   implementing a time synchronization protocol that generates samples with two values, a first one relating to the stability of the clock and a second relating to the frequency drift, and an algorithm controlling the single oscillator for generating a voltage value from samples issuing from the time synchronization protocol.

2. The communication device according to claim 1, wherein the communication device stores software intended to be executed by the general processor for maintaining the oscillator at constant temperature by means of a radiator.

3. The communication device according to claim 1, wherein, the general processor having a Pulse Width Modulation converter, the oscillator control algorithm is intended to generate a Pulse Width Modulation signal by means of this converter from the voltage value;

the communication device further comprising a circuit that converts the Pulse Width Modulation signal into a voltage signal applied to the oscillator shaped and filtered with sufficient precision and stability to ensure the final precision of the frequency of the system.

4. The communication device according to claim 3, wherein said circuit is composed of:
- a voltage calibrator receiving the Pulse Width Modulation signal;
- a second-order low-pass filter filtering the output of the voltage calibrator; and
- an operational amplifier connected as a follower and interposed between the output of the second-order low-pass filter and the oscillator.

5. The communication device according to claim 4, wherein a logic gate is interposed between the Pulse Width Modulation converter and the voltage calibrator and is adapted to reduce the transition times of the Pulse Width Modulation signal.

6. The communication device according to claim 1, wherein the oscillator control algorithm is intended to:
- receive samples issued from the synchronization protocol;
- eliminate the samples the stability of which is insufficient;
- sort the qualified samples by the drift value thereof and eliminating the samples with the smallest and greatest drift;
- calculate the average of the drift of the remaining samples; and
- calculate the voltage value from the average.

7. A method of controlling an oscillator, the method being implemented in a communication device comprising said oscillator, a general processor and a radio communication subsystem, said oscillator generating a reference clock signal of the radio communication subsystem, the reference clock signal of the radio communication subsystem being synchronized with at least one distant reference source through a packet communication network, wherein, the reference clock of the general processor and the reference clock of the radio subsystem being generated from a single oscillator, the method comprises, implemented in software form by the general processor:

generating, according to a time synchronization protocol, samples with two values, a first one relating to a clock stability and a second one relating to a frequency drift;

generating, according to an oscillator control algorithm, a voltage value from the samples issued from the time synchronization protocol generating said voltage value comprising:

receiving the samples issued from the time synchronization protocol;

eliminating the samples the stability of which is insufficient;

sorting the qualified samples by the drift value thereof and eliminating the samples with the smallest and greatest drift;

calculating the average of the drift of the remaining samples; and calculating the voltage value from the average.

* * * * *